United States Patent [19]
Takao et al.

[11] Patent Number: 6,112,034
[45] Date of Patent: Aug. 29, 2000

[54] FLEXIBLE PRINTED CIRCUIT BOARD

[75] Inventors: Hiromitsu Takao; Hidefumi Kaneko; Toshio Kimijima, all of Tokyo, Japan

[73] Assignee: Asahi Kogaku Kogyo Kabushiki Kaisha, Tokyo, Japan

[21] Appl. No.: 09/250,461

[22] Filed: Feb. 16, 1999

Related U.S. Application Data

[62] Division of application No. 08/603,827, Feb. 20, 1996, Pat. No. 5,917,158.

[30]     Foreign Application Priority Data

Feb. 21, 1995 [JP] Japan .................................. 7-32440

[51] Int. Cl.⁷ .................................................... G03B 17/00
[52] U.S. Cl. ............................................................ 396/542
[58] Field of Search ................................................ 396/542

[56]            References Cited

U.S. PATENT DOCUMENTS

| | | | |
|---|---|---|---|
| 4,711,548 | 12/1987 | Arakawa et al. | 396/542 |
| 5,181,065 | 1/1993 | Hara | 396/542 |
| 5,917,158 | 6/1999 | Takao et al. | 174/254 |

FOREIGN PATENT DOCUMENTS 5-67478   3/1993   Japan .

*Primary Examiner*—David M. Gray
*Attorney, Agent, or Firm*—Pitney, Hardin, Kipp & Szuch LLP

[57]            ABSTRACT

A flexible printed circuit board, comprises a single board on which a circuit arrangement is provided, a main body formed as a part of the single board, a folding portion formed as another part of the single board, a set of copper foil lines, provided on the main body, a set of copper foil lines, provided on the folding portion, and wherein the folding portion is folded toward the main body so that the copper foil lines on both the main body and the folding portion are electrically connected.

11 Claims, 5 Drawing Sheets

FLEXIBLE PRINTED CIRCUIT BOARD

This is a divisional of Ser. No. 08/603,827 filed Feb. 20, 1996, now U.S. Pat. No. 5,917,158.

BACKGROUND OF THE INVENTION

1. Field of the Invention

The present invention relates to a flexible printed circuit board (FPC).

2. Description of Related Art

A known printed circuit board is an indispensable component in electric and/or electronic devices nowadays. In a printed circuit board in general, a circuit, comprising a plurality of lines, for electrically connecting IC-chips, resistors, capacitors and so forth, is made by conductive thin copper foil lines, and an insulative base plate, on which the circuit is printed. A printed circuit board having such a structure has been widely used due to accuracy for circuit arrangement, and compactness and easy-assembly for installation into devices.

As a type of improvement from the printed circuit board, a flexible printed circuit board (FPC) has been developed. In addition to the merits mentioned for the printed circuit board, a flexible printed circuit board can be laid out with high degree of freedom due to flexibility in narrow spaces in machines and devices. This has been considered one of merits for a flexible printed circuit board.

By such a flexible printed circuit board, most of designed circuits can be, in principle, printed. However, for example, on a flexible printed board used for a camera, it is impossible to lay out circuits for a power supply and a strobe device, which usually require a wider copper foil line for a large current. If such a wider copper foil line is laid out on a FPC board, spaces for other lines have to be sacrificed. Accordingly, in a prior art, circuits requiring a large current are formed on a separate FPC board mainly for the purpose of collectively providing standard copper foil lines on a main FPC board. This separate FPC board and the main FPC boards are connected by lead wires, or lead wires themselves are used instead of flexible circuit boards for power supply and a strobe device.

In such an arrangement mentioned above, the number of parts increases, assembling-time is also made longer. In addition, spaces for installing both flexible printed circuit boards and lead wires have to be secured. Accordingly, manufacturing costs inevitably increase.

SUMMARY OF THE INVENTION

It is a main object of the present invention to provide a flexible printed circuit board, which can be installed in a device without increasing of the number of parts, and without requiring a larger space in a device exclusively for installing the flexible printed circuit board.

To achieve the object mentioned above, according to the present invention, there is provided a flexible printed circuit board comprises a single board on which a circuit arrangement is provided,. a main body formed as a part of the single board, a folding portion formed as another part of the single board, a set of copper foil lines, provided on the main body, a set of copper foil lines, provided on the folding portion, and, wherein said folding portion is folded toward the main body so that the copper foil lines on both the main body and the folding portion are electrically connected.

According to a first development of the present invention, the flexible printed circuit board is effectively used in a case where the main circuit and the auxiliary circuit are provided for a power supply, which usually requires wider copper foil lines. It is effective to lay out a part of the circuit as the auxiliary circuit, which may be occupied with wider copper foil lines on the folding portion of the flexible printed circuit board. By this arrangement, the space consuming circuit is separately laid out from other circuits on the main body of the flexible printed circuit board. Actually, since such a line for a large current is laid out on the folding portion, areas on the main boy of the flexible printed circuit board can be used for other circuits of different purposes, and a circuit density can be increased on the main body. Moreover even if a part of the circuit (the auxiliary circuit) is laid out on the folding portion, the main circuit and the auxiliary circuit are laid out on the same base plate of the single flexible printed circuit board, which means that no additional parts are required, and even more the number of parts can be reduced. Furthermore, even a space for installing a flexible printed circuit board is minimized because as explained the same flexible printed circuit board is folded to use.

According to a second development of the present invention, the flexible printed circuit board used for a single lens reflex camera is explained. The flexible printed circuit board of the second development is formed in an elongated shape. The length and width is deter mined so that the flexible printed circuit board in a folded fashion is laid out in an area from the upper portion of the spool chamber to the upper portion of the penta-prism and the upper portion of the patrone chamber. A folding portion is formed to have a narrower width and shorter length than that of the main body. The folding portion is folded along a folding line provided at the side of spool chamber or the patrone chamber. Terminals for the auxiliary circuit are provided at the end of the folding portion. These terminals and terminals for the main circuit on the main body are connected at a side of a roof portion of the penta-prism. It should be noted that in the single lens reflex camera, the main and auxiliary circuits can also be used for a strobe device as well as a power supply, which may require wider copper foil lines.

The present disclosure relates to subject matter contained in Japanese patent application No. 7-32440 (filed on Feb. 21, 1995) which is expressly incorporated herein by reference in its entirety.

DESCRIPTION OF THE PREFERRED EMBODIMENT

Figure 1:
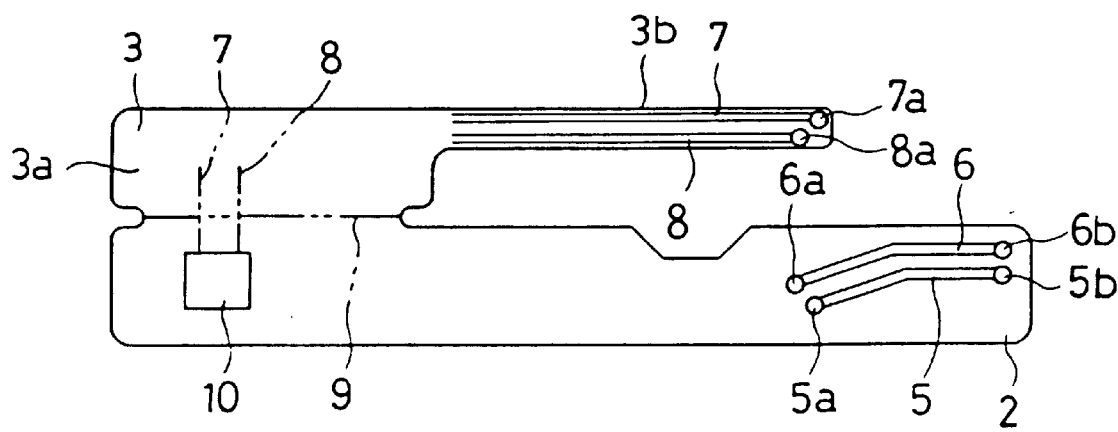
FIG. 1 is an exploded plane view of the flexible printed circuit board before folded according to the first embodiment.
Figure 2:
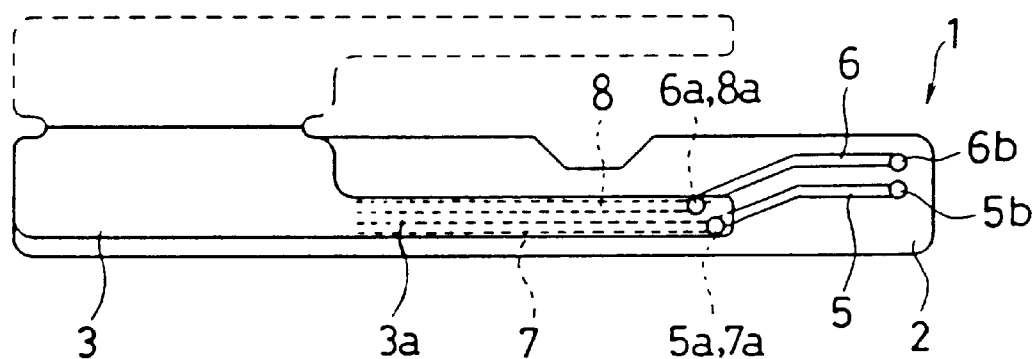
FIG. 2 is a plane view of the flexible printed circuit board of the first embodiment folded along the folding line.

The first development according to the present invention will be explained along FIG. 1 and FIG. 2.

A flexible printed circuit board (hereinafter FPC board) 1 is formed on a single board. The FPC board 1 comprises an elongated main body 2 and a folding portion 3 to be folded and overlapped over the main body 2. Therefore, for the purpose of folding, a folding line 9 is formed to functionally separate the main body 2 and the folding portion 3. The folding line 9 is formed on the left side of the FPC board 1 in FIG. 1. The folding portion 3 comprises a stem portion 3a where the folding line 9 is formed, and an elongated portion 3b extending to the right side in FIG. 1.

On the folding portion 3, auxiliary copper foil lines (herein after line(s)) 7 and 8 are provided, and connected to an IC-chip 10. At the end of the auxiliary lines 7 and 8 on the elongated portion 3b, there are provided respective terminals 7a and 8a. On the main body 2, there are provided main lines 5 and 6, which are not connected to the IC-chip 10. At the both ends of the lines, there are provided output terminals 5a and 6a, which are arranged to connect the terminals 7a, 8a and the output terminals 5b, 6b. As shown in FIG. 2, the terminals 5a and 6a on the main body 2, and the terminals 7a and 8a on the folding portions 3 are designed to come into contact with each other when the folding portion 2 is folded. In the first development of the present invention, only the lines related to the IC-chip 10 are shown in FIG. 1 and FIG. 2, and it should be noted that lines for other purposes are not shown therein for the purpose of clarity.

As explained, when the folding portion 2 of the FPC board 1 is folded along the folding line 9, the folding portion 2 is folded and overlapped on the main body 2, and the terminals 7a and 8a come into contact with the terminals 5a and 6a. Furthermore, an assembly work of the FPC board 1 is completed by soldering or press-welding these four terminals 5a–7a, 6a–8a so that electrical continuity is attained. When the main lines 5 and 6, and the auxiliary lines 7 and 8 are power supply lines, the output terminals 5b and 6b can be provided to connect an outside power source. Accordingly, power is supplied to the IC-chip 10 through the main lines 5 and 6 and the auxiliary lines 7 and 8. As a merit of the first development according to the present invention, as the auxiliary lines 7 and 8 are provided on the folding portion 2, the capacity of lines (i.e. represented by an width of line) can be increased regardless of the line arrangements or circuit arrangement on the main body 2.

Figure 3:
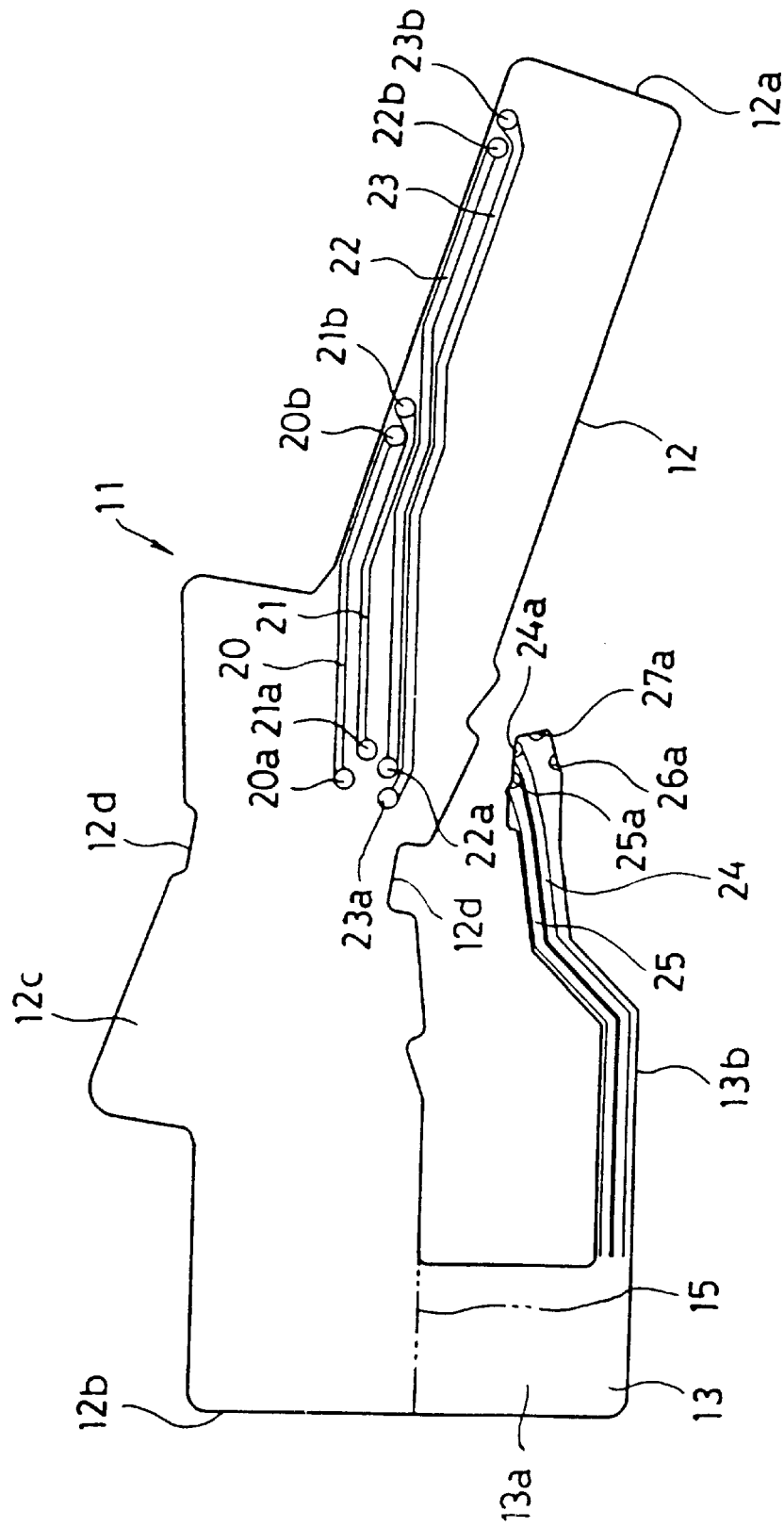
FIG. 3 is an exploded plane view of the flexible printed circuit board before folded in accordance with the second embodiment.
Figure 4:
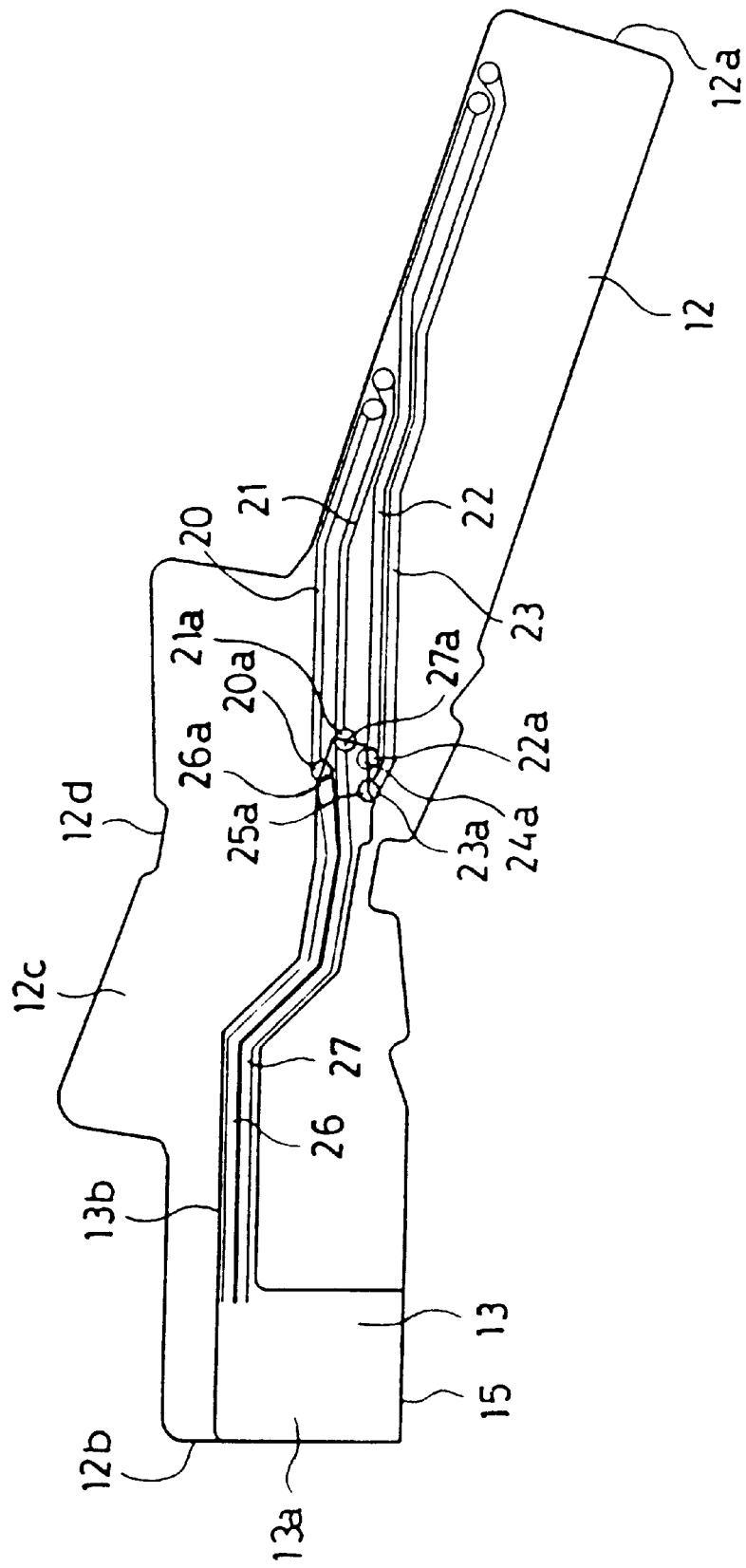
FIG. 4 is a plane view of the flexible printed circuit board of the second embodiment folded along the folding line.
Figure 6:
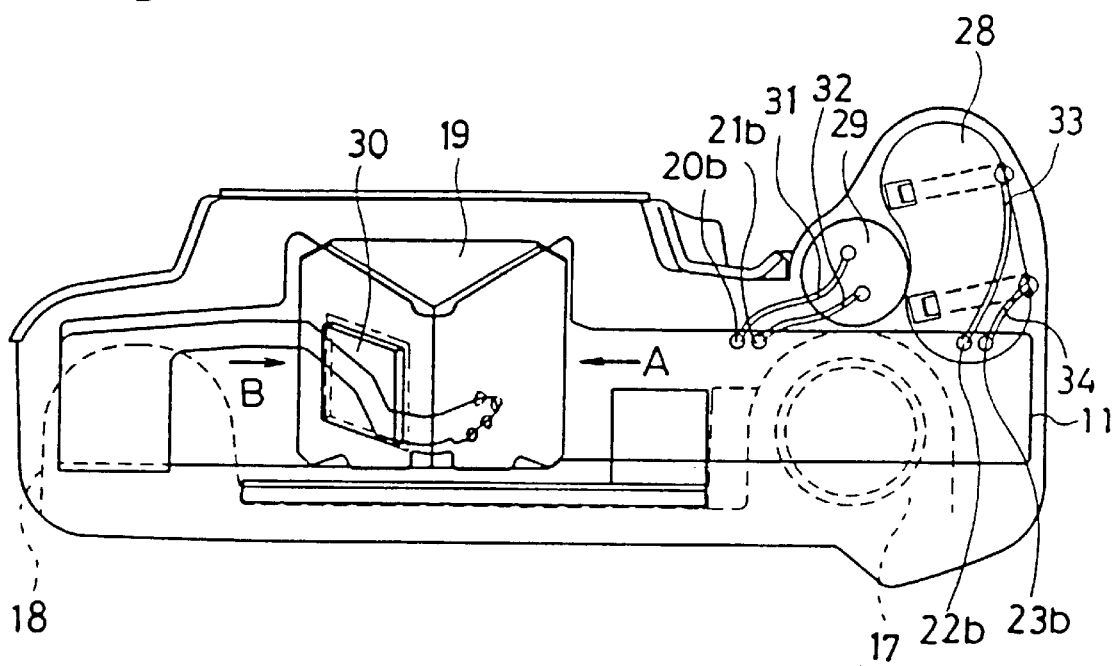
FIG. 6 is a plane view of the single lens reflex camera of FIG. 5, to which the flexible printed circuit board is laid out.
Figure 5:
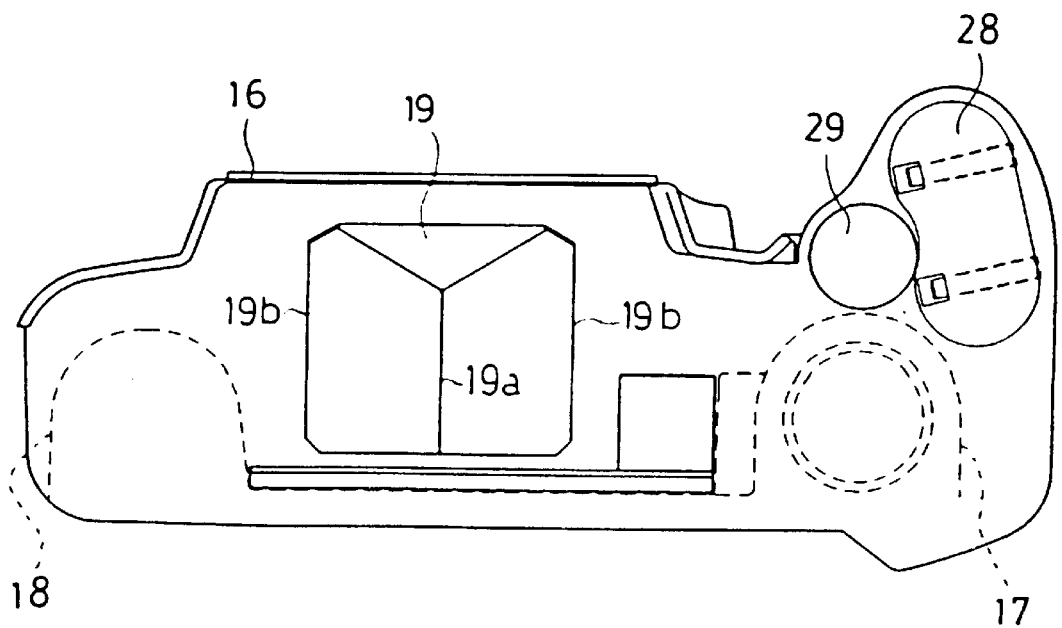
FIG. 5 is a plane view of the single lens reflex camera before the installation of the flexible printed circuit board of FIG. 3.

The second development will be explained along FIG. 3 through FIG. 8. In this development, a flexible printed circuit board 11 (FPC board) 11 is applied to a single lens reflex camera. A single reflex camera, to which the second development of the present invention is applied, is shown in FIG. 5. This drawing is showing a plane view of a main body of the camera. At the right hand side in FIG. 5, there are provided a spool chamber 17, a battery (a power source) 28, and a capacitor 29 for the strobe device. At the left hand side, there is provided a patrone (cartridge) chamber 18. In FIG. 5, between the patrone chamber 18 and the spool chamber 17, there is provided a penta-prism 19. The FPC board 11 is formed on a single board. The FPC board 11 comprises a main body 12 and a folding portion 13 to be overlapped on the main body 12. The main body 12 is formed in a predetermined shape as shown in FIG. 3, but not limited to the shown one. The folding portion 13 is designed to be folded toward the main body 12 along a folding line 15 shown in FIG. 3, FIG. 4 and FIG. 6. The folding portion 13 includes a stem portion 13a and an elongated portion 13b. An end portion 12a of the main body 12 is installed at the side of the spool chamber 17, the other end portion 12b is installed at the side of the patrone chamber 18. In addition to these two ends portions 12a and 12b, a protruded portion 12c is form ed at a predetermined area closer to the end portion 12b (i.e., near the patrone chamber 18) than the end portion 12a (i.e., near the spool chamber 17) so that the FPC board 11 follows a roof portion of the penta prism 19.

On the main body 12, main copper foil lines (hereinafter line(s)) 20, 21 for the capacitor 29 of the strobe device, and main lines 22, 23 for the battery 28 are printed. On the other hand, as shown in FIG. 3, on one surface of the elongated portion 13b of the folding portion 13 (hereinafter the front surface of the elongated portion 13b), sub-lines 24, 25 for the capacitor 29 of the strobe device are printed. On the other surface of the elongated portion 13b (hereinafter the back surface of the elongated portion 13b), as shown in FIG. 4, sub-lines 26, 27 for the battery 28 are printed. It should be noted that the main lines 20, 21, 22 and 23 are formed on a surface of the main body 12 so that these lines 20, 21, 22 and 23 can be recognized with the sub-lines 24, 25 on the front surface of the folding portion 13 under the exploded condition (or plan view state) as shown in FIG. 3. An end of respective sub-lines 24 through 27 is formed as a respective terminals provided on the end of the elongated portion 13b. The other end of respective sub-lines 24 through 27 are connected to an IC-chip 30 (see FIG. 6) provided on the main body 12 of the FPC board 11.

Unlike the sub-lines on the folding portion 13, the main lines 20 through 23 are not connected to the IC-chip 30. Instead of being connected to the IC-chip 30, both end of respective main lines 20 through 23 are formed as terminals 20a through 23a, and terminals 20b through 23b. According to FIG. 3, the terminals 20a through 23a are located around the center portion of the main body 12, and the terminals 20b through 23b are located along a part of contour of the main body 12. The terminals 20a through 23a are arranged to correspond to the terminals 24a through 27a of the sub-lines on the folding portion 13. For the purpose of clarity, only the lines on the strobe device and the power source are shown in the drawings.

Figure 7:
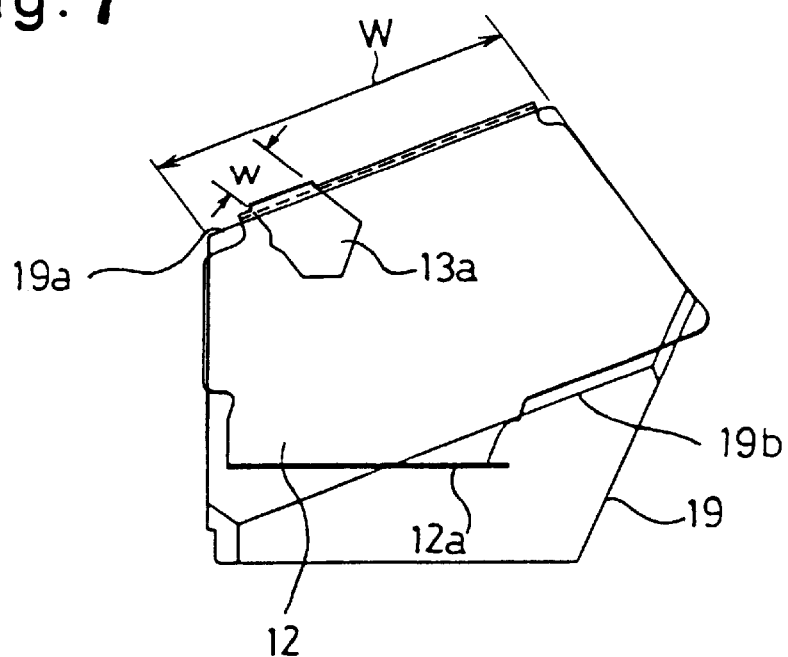
FIG. 7 is a view of the penta-prism seen from the arrow A in FIG. 6.
Figure 8:
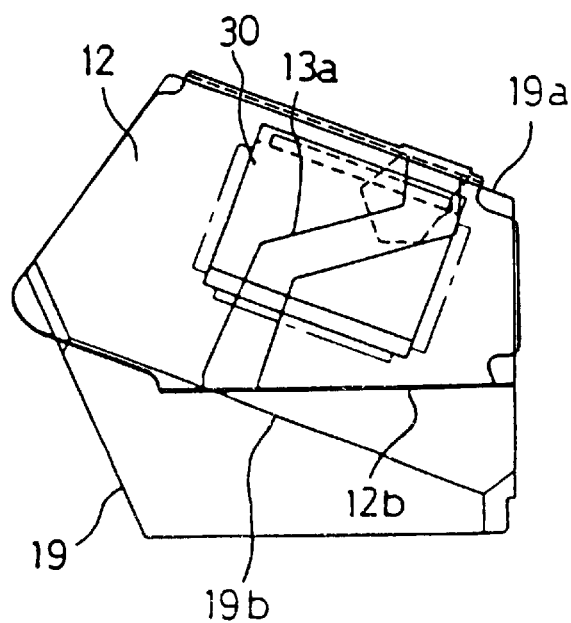
FIG. 8 is a view of the penta-prism seen from the arrow B in FIG. 6.

The protruded portion 12c will be explained according to FIG. 7 and FIG. 8. A peak edge 19a, having the width of "W" of the penta prism 19 is shorter than the that of a foot edge 19b. To follow this three-dimensional contour of the penta prism 19, the protruded portion 12c is provided with dent portions 12d, which correspond to the peak edge 19a. From the dent portions 12b, the protruded portion 12c is formed to extend gradually to follow the roof portion of the penta prism 19 toward the foot edge 19b. According to the protruded portion 12c of this configuration, the area of roof portion of the penta prism 19 can be effectively utilized. It is proposed that the width "w" of the elongated portion 13b seen in FIG. 7 should be narrower than the width "W" of the peak edge 19a, or equal to the width "W" at maximum.

As the structure of the FPC board 11 is explained, a manner of installation and preforming the FPC board 11 will be explained. When the FPC board. 11 is folded along the folding line 15, the terminals 22a, 23a, 20a and 21a of the main body 12 come into contact with the terminals 24a, 25a, 26a and 27a of the elongated portion 13b of the folding portion 13, as shown in FIG. 4. Then, these terminals are soldered or press-welded each other to complete the electrical connection to the IC-chip 30. By connecting the terminals 20a–26a, 21a–27a, 22a–24a, and 23a–25a, all the main and sub lines on the main body 12 and folding portion 13 are connected to the IC-chip 30. In other words, the output terminals 20b through 23b on the main body 12 are ready for being connected to the capacitor 29 of the strobe device and the battery 28.

After the lines on the FPC board 11 is connected, the capacitor 29 for the strobe device is connected to the output terminals 20b and 21b through lead-lines 31 and 32. Similarly, the battery 28 as the power source is connected to the output terminals 22b and 23b through lead- lines 33 and 34. The electric power is supplied to the IC-chip 30 from the battery 28 through the main and sub-lines on the FPC board 11. The electric power is also supplied to the capacitor 29 for the strobe device through the main and sub-lines of the FPC board 11. It should be noted that as the sub-lines 24 through 27 are laid out on the folding portion 13, the width of these lines can be made larger without taking the circuit arrangements on the main body 12 into consideration.

The lines on the main body 12 and the elongated portion 13 are explained according to FIGS. 3 through 8. However, the line arrangements can be modified in accordance with the location of the capacitor 29 for the strobe device and the batter 28 in the single lens reflex camera 16.

According to the present invention, the lines for the strobe device and/or the power source, which may require wider copper foil lines, are beforehand provided on the folding portion of the flexible printed circuit board, which is separated by the folding line from the main body. As explained, the flexible printed circuit board is folded along the folding line for an actual use. In other words, the lines requiring large space are separately provided from other lines requiring less space, and yet according to the arrangement of the flexible printed circuit board of the present invention, no additional parts are required because all the lines are made on the same single base. Therefore, assembly work will be easy, and cost reduction will be possible.

Furthermore, in particular, according to the second development, a compact arrangement of wiring around a penta-prism of a single lens reflex camera can be materialized by utilizing flexibility, which is considered a characteristic of the FPC board.

What is claimed is:

1. A single lens reflex camera including a flexible printed circuit board, comprising:
   a camera body;
   a strobe device including a capacitor;
   a power source for predetermined operations for said camera;
   a battery;
   a penta-prism;
   said flexible printed circuit board, comprising: a single board on which a circuit arrangement is provided; a main body formed as part of said single board, said main body including a protruded portion to follow a roof of said penta-prism when installed, said protruded portion being provided with dent portions to correspond to the peak of said penta-prism;
   a folding portion formed as another part of said single board;
   a set of copper foil lines for said power source, provided on said main body;
   a set of copper foil lines for said capacitor of said strobe device, provided on said main body;
   a set of copper foil lines for said battery, provided on said main body;
   a set of copper foil lines for said power source, provided on said folding portion;
   a set of copper foil sub-lines for said capacitor of said strobe device, provided on said folding portion;
   a set of copper foil sub-lines for said battery, provided on said folding portion;
   wherein a first end of one of said sub-lines is a first terminal for contacting a second terminal on one of said lines, and a second of said one of said sub-lines is connected to an IC chip on said main body; and,
   wherein said main portion and said folding portion are folded toward each other so that said copper foil lines on both said main body and said folding portion are connected to complete an electric connection from said power source.

2. The single lens reflex camera including flexible printed circuit board according to claim 1, wherein a set of copper foil lines, for a strobe device, are provided on both main body and said folding portion.

3. The single lens reflex camera including flexible printed circuit board according to claim 1, wherein said copper foil lines for said power source on said folding portion is provided on one surface of said folding portion, and said copper foil lines for said strobe device on said folding portion are provided on the other surface of said folding portion.

4. The single lens reflex camera including flexible printed circuit board according to claim 3, wherein an end of respective lines of both main body and said folding portion are formed as a terminal so that all lines on both surfaces of said folding portion are connected to said lines on said main portion through said terminal when folded.

5. The single lens reflex camera including flexible printed circuit board, according to claim 1, wherein said main body and said folding portion demarcated by a folding line formed on said single board.

6. The single lens reflex camera including flexible printed circuit board, according to claim 1, wherein an IC-chip is provided on said main body, said IC-chip and said set of copper foil lines are separated by a predetermined distance on said main body of said flexible printed circuit board.

7. The single lens reflex camera including flexible printed circuit board, according to claim 1, wherein said set of copper foil lines on both said main body and said folding portion are arranged to have wider copper foil lines adapted to allow a large current from said power source, compared with other lines on said main body.

8. The single lens reflex camera including flexible printed circuit board, according to claim 1, wherein said flexible printed circuit board in folded form is laid out in an area over said penta prism, a spool chamber and a patrone chamber in said single lens reflex camera.

9. The single lens reflex camera including flexible printed circuit board, according to claim 2, wherein said set of copper foil lines on both said main body and said folding portion are arranged to have wider copper foil lines adapted to allow a large current to said strobe device, compared with other lines on said main body.

10. The single lens reflex camera of claim 1 wherein said camera body includes a first end and a second end, said first end being proximate to a spool chamber and said second end being proximate to a patrone chamber.

11. The single lens reflex camera of claim 10 wherein said battery and said capacitor are contained within said camera body proximate to said spool chamber.

* * * * *